US012745592B2

(12) United States Patent
Khalaf

(10) Patent No.: US 12,745,592 B2
(45) Date of Patent: Sep. 22, 2026

(54) METHODS AND SYSTEMS FOR CONTROLLING UNDERFILL BLEED-OUT IN SEMICONDUCTOR PACKAGING

(71) Applicant: SK Hynix NAND Product Solutions Corp., Rancho Cordova, CA (US)

(72) Inventor: Bilal Khalaf, Folsom, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 625 days.

(21) Appl. No.: 18/123,612

(22) Filed: Mar. 20, 2023

(65) Prior Publication Data

US 2024/0321609 A1 Sep. 26, 2024

(51) Int. Cl.

| | |
|---|---|
| ***H10P 72/00*** | (2026.01) |
| ***H10P 72/70*** | (2026.01) |
| ***H10W 74/01*** | (2026.01) |
| ***H10W 74/15*** | (2026.01) |

(52) U.S. Cl.

CPC .......... *H10P 72/0604* (2026.01); *H10P 72/74* (2026.01); *H10W 74/012* (2026.01); *H10W 74/15* (2026.01)

(58) Field of Classification Search

CPC ............. H01L 21/67253; H01L 21/563; H01L 21/6835

USPC .............................................................. 438/5

See application file for complete search history.

(56) References Cited

U.S. PATENT DOCUMENTS

| | | | | |
|---|---|---|---|---|
| 7,728,440 B2 * | 6/2010 | Honda | H01L 23/24 | 257/710 |
| 7,999,368 B2 * | 8/2011 | Yim | H01L 25/105 | 438/109 |
| 8,129,828 B2 * | 3/2012 | Maeda | H01L 23/16 | 257/E23.18 |
| 8,502,400 B2 * | 8/2013 | Karpur | H01L 21/563 | 257/778 |

(Continued)

FOREIGN PATENT DOCUMENTS

| | | |
|---|---|---|
| KR | 20070017671 A | 2/2007 |
| KR | 20170071791 A | 6/2017 |

OTHER PUBLICATIONS

SK Hynix NAND Product Solutions Corp. (dba Solidigm), PCT/US2024/020001, International Search Report and Written Opinion, Jul. 24, 2024, 10 pgs.

*Primary Examiner* — Vu A Vu

(74) *Attorney, Agent, or Firm* — Morgan, Lewis & Bockius LLP

(57) ABSTRACT

This application is directed to controlling underfill bleed-out in semiconductor packaging. A first substrate is disposed on a support substrate, and a bracket structure is placed on the support substrate with a first separation from the first substrate. An underfill material is applied on the support substrate. The bracket structure automatically controls bleed-out of the underfill material. In some embodiments, in accordance with a determination that the underfill material is substantially hardened, the bracket structure is removed from the support substrate. In some embodiments, the first substrate includes a semiconductor package, and the support substrate includes a printed circuit board (PCB). Alternatively, in some embodiments, the first substrate includes a chip, and the support substrate includes a semiconductor (Continued)

package and forms a system in a package (SiP) with the first substrate.

20 Claims, 11 Drawing Sheets

(56) References Cited

U.S. PATENT DOCUMENTS

| | | | | |
|---|---|---|---|---|
| 9,966,278 | B1 | 5/2018 | Kim et al. | |
| 10,438,863 | B1 * | 10/2019 | Boja | H01L 21/52 |
| 10,796,976 | B2 * | 10/2020 | Pan | H01L 21/4853 |
| 10,879,194 | B2 * | 12/2020 | Lin | H01L 21/56 |
| 11,437,293 | B2 * | 9/2022 | Kim | H01L 25/0652 |
| 11,456,287 | B2 * | 9/2022 | Hu | H10P 72/74 |
| 11,658,086 | B2 * | 5/2023 | Park | H01L 25/50 257/712 |
| 11,664,286 | B2 * | 5/2023 | Chen | H01L 21/565 257/690 |
| 12,074,141 | B2 * | 8/2024 | Shin | H01L 25/105 |
| 12,113,027 | B2 * | 10/2024 | Lu | H01L 25/18 |
| 2003/0203542 | A1 * | 10/2003 | Chee | H01L 21/563 257/E21.705 |
| 2012/0068353 | A1 | 3/2012 | Huang et al. | |
| 2018/0342466 | A1 | 11/2018 | Lin et al. | |
| 2022/0293565 | A1 * | 9/2022 | Shin | H10W 90/00 |
| 2024/0071849 | A1 * | 2/2024 | Chen | H01L 21/4857 |

* cited by examiner

400A
BB'
204

400B
BB'
202
204

400C
BB'
$S_1$
202
$S_1$
220
204
402

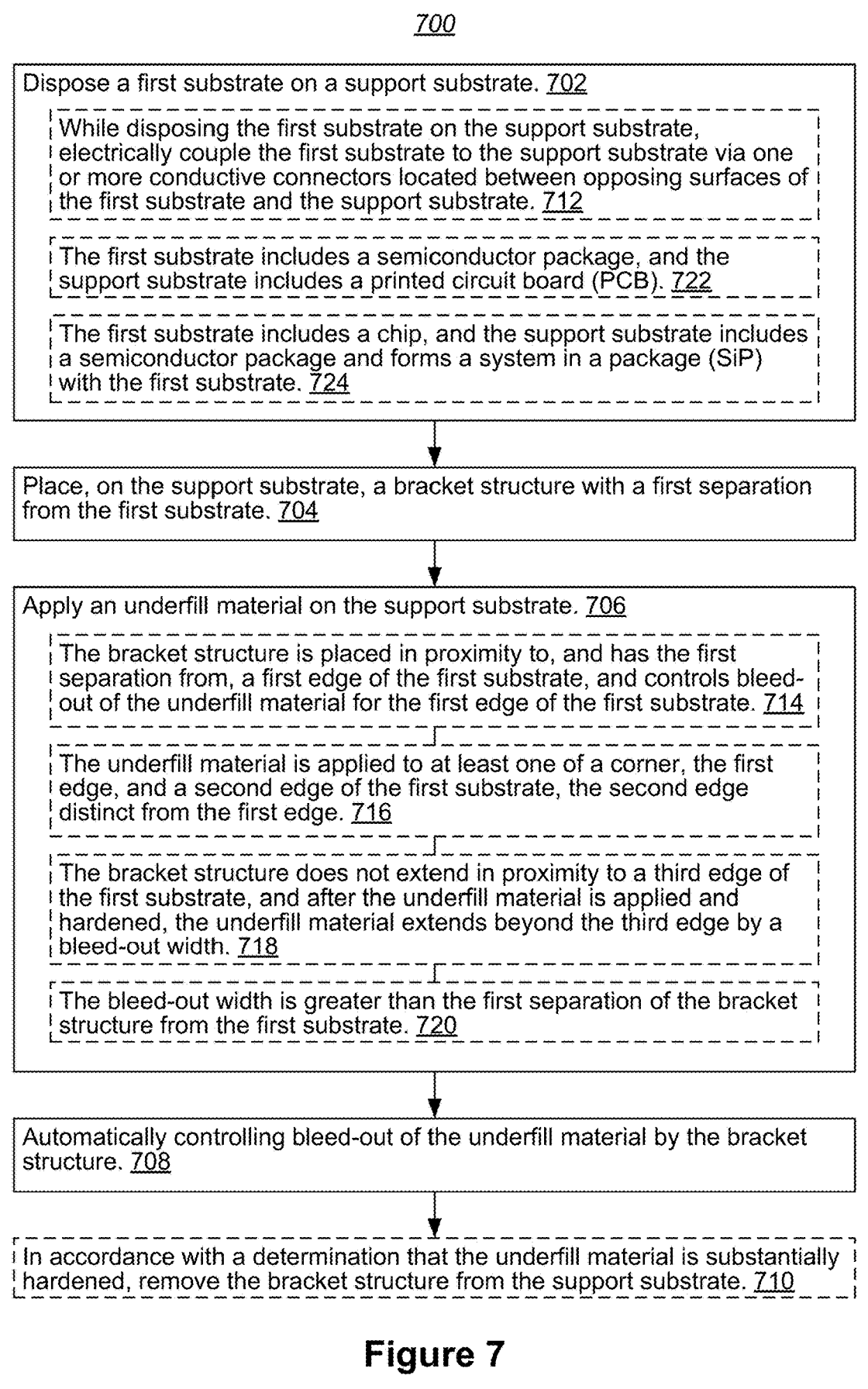

700

Dispose a first substrate on a support substrate. 702

While disposing the first substrate on the support substrate, electrically couple the first substrate to the support substrate via one or more conductive connectors located between opposing surfaces of the first substrate and the support substrate. 712

The first substrate includes a semiconductor package, and the support substrate includes a printed circuit board (PCB). 722

The first substrate includes a chip, and the support substrate includes a semiconductor package and forms a system in a package (SiP) with the first substrate. 724

Place, on the support substrate, a bracket structure with a first separation from the first substrate. 704

Apply an underfill material on the support substrate. 706

The bracket structure is placed in proximity to, and has the first separation from, a first edge of the first substrate, and controls bleed-out of the underfill material for the first edge of the first substrate. 714

The underfill material is applied to at least one of a corner, the first edge, and a second edge of the first substrate, the second edge distinct from the first edge. 716

The bracket structure does not extend in proximity to a third edge of the first substrate, and after the underfill material is applied and hardened, the underfill material extends beyond the third edge by a bleed-out width. 718

The bleed-out width is greater than the first separation of the bracket structure from the first substrate. 720

Automatically controlling bleed-out of the underfill material by the bracket structure. 708

In accordance with a determination that the underfill material is substantially hardened, remove the bracket structure from the support substrate. 710

Figure 7

METHODS AND SYSTEMS FOR CONTROLLING UNDERFILL BLEED-OUT IN SEMICONDUCTOR PACKAGING

TECHNICAL FIELD

This application relates generally to semiconductor packaging technology including, but not limited to, methods, systems, and devices for controlling bleed-out of an underfill material that mechanically fixes a substrate in an electronic device.

BACKGROUND

Silicon dies are mounted on packaging surfaces using an underfill. The underfill is dispensed on at least one side of a silicon die and bleeds out on other exhaust sides on which no underfill is dispensed. Keep out zones (KOZs) have to be reserved immediately around four sides of each silicon die to allow for injection or bleed-out of the underfill. Some electronic devices require that widths of KOZs where the underfill is dispensed or bleeds out be controlled below threshold widths. Widths of KOZs (e.g., 1 mm) where the underfill is dispensed are often greater than widths of KOZs (e.g., 0.5 mm) where the underfill bleeds out. Additional electronic components have to be kept out of the KOZs (e.g., keep at least 0.5 or 1 mm away from the silicon dies) when mounted on the packaging surfaces. In some situations, the underfill is dispensed on four sides of the silicon die, resulting in a total area of the KOZs that is even greater compared with when only one side of the silicon die is used to dispense the underfill. The widths of these KOZs determine a package density in which the silicon dies and electronic components are packaged. It would be beneficial to reduce widths of KOZs surrounding silicon dies to enhance a package density and cost effectiveness of an electronic device.

SUMMARY

Various embodiments of this application are directed to methods, systems, and devices for controlling bleed-out of an underfill material surrounding one or more sides of a substrate. After a first substrate is disposed on a support substrate, a bracket structure is placed on the support substrate with a first separation from the first substrate. The underfill material is applied on the support substrate and from at least one corner or side of the first substrate. The underfill material flows between the first substrate and the support substrate until it is hardened. During this process, the bracket structure automatically controls bleed-out of the underfill material within a respective keep out zone (KOZ) (also called a bleed-out region) surrounding the first substrate. After the underfill material is substantially hardened, the bracket structure is removed from the support substrate. By these means, the bleed-out of the underfill material is controlled to reduce distances of the first substrate from an adjacent substrate or electronic component. A smaller support substrate may be used to package the first substrate with the other substrate or electronic component. Alternatively, the same support substrate can package more substrates or electronic components.

Specifically, the bracket structure serves as a barrier to the underfill material, limiting movement of the underfill material in one or both of two planar directions parallel to a top surface of the support substrate. In some embodiments, the underfill material has a predefined volume. Compared with when the bleed-out is not limited by the bracket structure, the underfill material has a greater thickness when the bracket structure is applied. Alternatively, in some embodiments, the predefined volume is reduced when the bracket structure is applied, such that the underfill material keeps substantially the same thickness compared with when the bleed-out is not limited by the bracket structure. The less the predefined volume of the underfill material, the shorter a throughput time and the lower a manufacturing cost of the electronic device. In some embodiments, the bracket structure is applied after the first substrate is mechanically and electrically coupled the support substrate and before the underfill material is dispensed. The bracket structure is removed once the underfill material cures. Compared with the unlimited bleed-out of the underfill material, the KOZ zone defined by the bracket structure is narrower and allows other substrates or electronic components to be placed closer to the first substrate. In some embodiments, the bracket structure includes a quadrilateral bracket. In some embodiments, the bracket structure includes a single side configured to control a flow of the underfill material in one direction. In some embodiments, the bracket structure includes two connected sides configured to control a flow of the underfill material in two directions, e.g., for edge fills or corner fills.

In one aspect, a method is implemented to control underfill bleed-out. The method includes disposing a first substrate on a support substrate and placing, on the support substrate, a bracket structure with a first separation from the first substrate. The method further includes applying an underfill material on the support substrate and automatically controlling bleed-out of the underfill material by the bracket structure. In some embodiments, the method further includes in accordance with a determination that the underfill material is substantially hardened, removing the bracket structure from the support substrate.

In some embodiments, the first substrate includes a semiconductor package, and the support substrate includes a printed circuit board (PCB). Alternatively, in some embodiments, the first substrate includes a chip, and the support substrate includes a semiconductor package and forms a system in a package (SiP) with the first substrate.

In some embodiments, the method further includes while disposing the first substrate on the support substrate, electrically coupling the first substrate electrically to the support substrate via one or more conductive connectors located between opposing surfaces of the first substrate and the support substrate.

In some embodiments, the bracket structure is placed in proximity to, and has the first separation from, a first edge of the first substrate, and controls bleed-out of the underfill material for the first edge of the first substrate. The underfill material is applied to at least one of a corner, the first edge, and a second edge of the first substrate, the second edge distinct from the first edge.

In some embodiments, the method includes disposing a second substrate on the support substrate. The bracket structure extends in proximity to the second substrate and has a second separation from the second substrate. After the first and second substrates are disposed, the underfill material is applied sequentially to the first substrate and the second substrate. Bleed-out of the underfill material under the second substrate is automatically controlled by the bracket structure.

In another aspect, some implementations include an electronic device that includes a support substrate, a first substrate disposed on a support substrate, and an underfill material applied between the support substrate and the first substrate. At least a portion of the underfill material has a raised edge at a first distance from the first substrate. Further, in some embodiments, the underfill material is hardened and configured to hold the first substrate at a first location of the support substrate.

In some embodiments, the first substrate is electrically coupled to the support substrate via one or more conductive connectors located between opposing surfaces of the first substrate and the support substrate.

In some embodiments, the first substrate has a plurality of edges. The raised edge of the underfill material is located in proximity to at least a portion of an edge, an edge, two edges, three edges, or four edges of the plurality of edges of the first substrate. Further, in some embodiments, the first distance is less than a predefined first separation limit. In some embodiments, the raised edge of the underfill material has a height greater than a threshold height associated with the first distance.

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIG. 7 is a flow diagram of an example method of controlling underfill bleed-out in an electronic device, in accordance with some embodiments.

Like reference numerals refer to corresponding parts throughout the several views of the drawings.

DETAILED DESCRIPTION

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices with digital video capabilities.

Figure 1:
FIG. 1 is a block diagram of an example system module in a typical electronic device in accordance with some embodiments.
Figure 1:
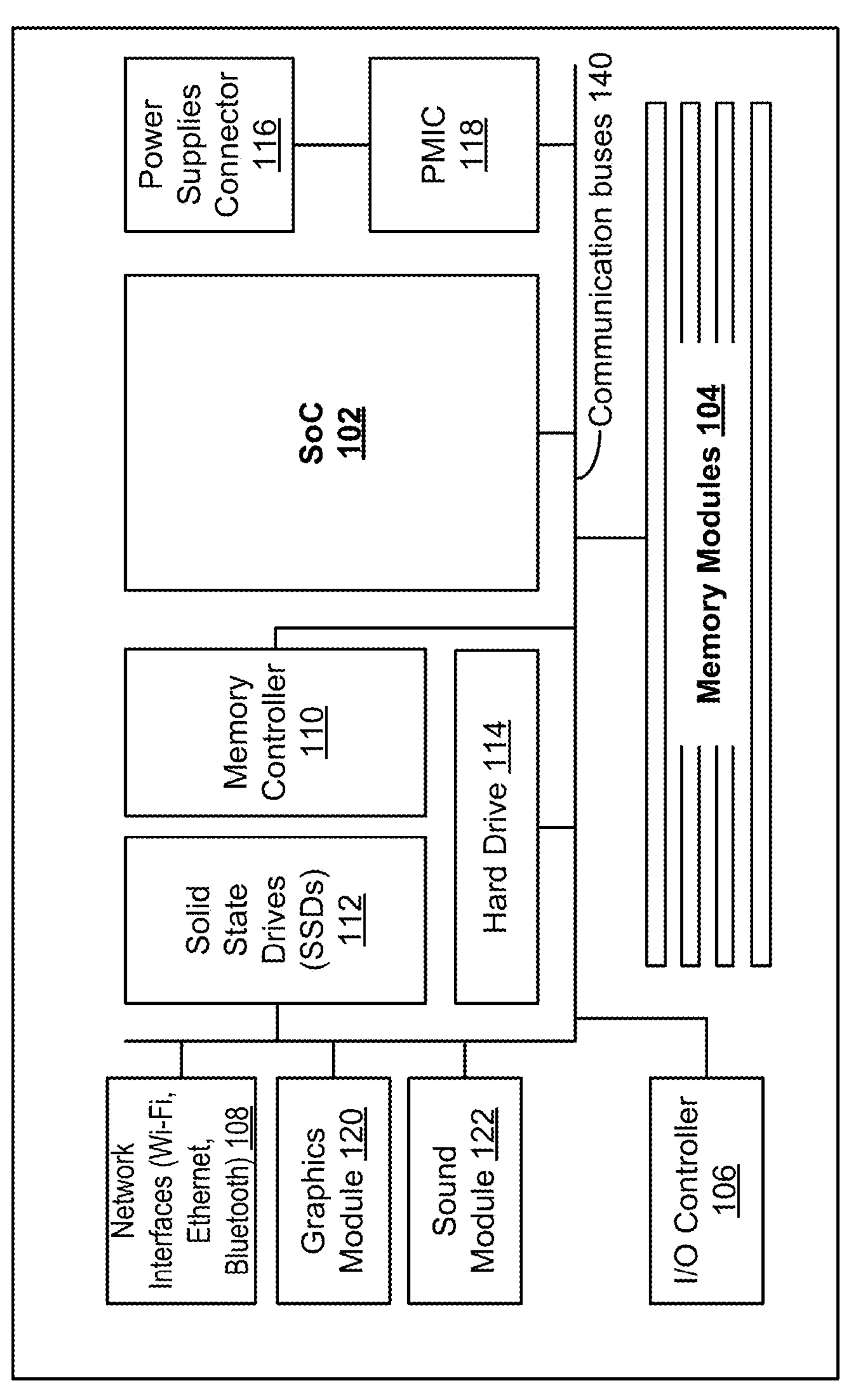

FIG. 1 is a block diagram of an example system module 100 in a typical electronic device in accordance with some embodiments. The system module 100 in this electronic device includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a trackpad) via a universal serial bus interface. In some embodiments, the network interfaces 108 includes one or more interfaces for Wi-Fi, Ethernet and Bluetooth networks, each allowing the electronic device to exchange data with an external source, e.g., a server or another electronic device. In some embodiments, the communication buses 150 include circuitry (sometimes called a chipset) that interconnects and controls communications among various system components included in system module 100.

In some embodiments, the memory modules 104 include high-speed random access memory, such as DRAM, static random access memory (SRAM), double data rate (DDR) dynamic random access memory (RAM), or other random access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, solid state drives (SSDs) 112, a hard disk drive (HDD) 114, power management integrated circuit (PMIC) 118, a graphics module 120, and a sound module 122. The memory controller 110 is configured to control communication between the processor module 102 and memory components, including the memory modules 104, in electronic device. The SSDs 112 are configured to apply integrated circuit assemblies to store data in the electronic device, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V, 1.8V, or any other suitable voltage levels, as required by various components or circuits (e.g., the processor module 102) within the electronic device. The graphics module 120 is configured to generate a feed of output images to one or more display devices according to their desirable image/video formats. The sound module 122 is configured to facilitate the input and output of audio signals to and from the electronic device under control of computer programs.

It is noted that communication buses 140 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to semiconductor packaging technology applied to form one or more of the components 102-122 or package a subset of the components 102-122 on the same substrate (e.g., PCB). After a first substrate is disposed on a support substrate, an underfill material (also called an encapsulant) is applied from a corner or an edge of the first substrate and spread to fill a gap between the first and support substrates using surface tension of the underfill material. The underfill material improves reliability and durability of an assembly of the first and support substrates, making physical contact and electrical coupling more robust and reliable. Particularly, a bracket structure is placed on the support substrate with a first separation from the first substrate, after the first substrate is disposed and before the underfill material is dispensed on a support substrate. The resulting underfill material extends beyond sides of the first substrate and hardens with a substantially sharp and raised edge.

Figure 2A:
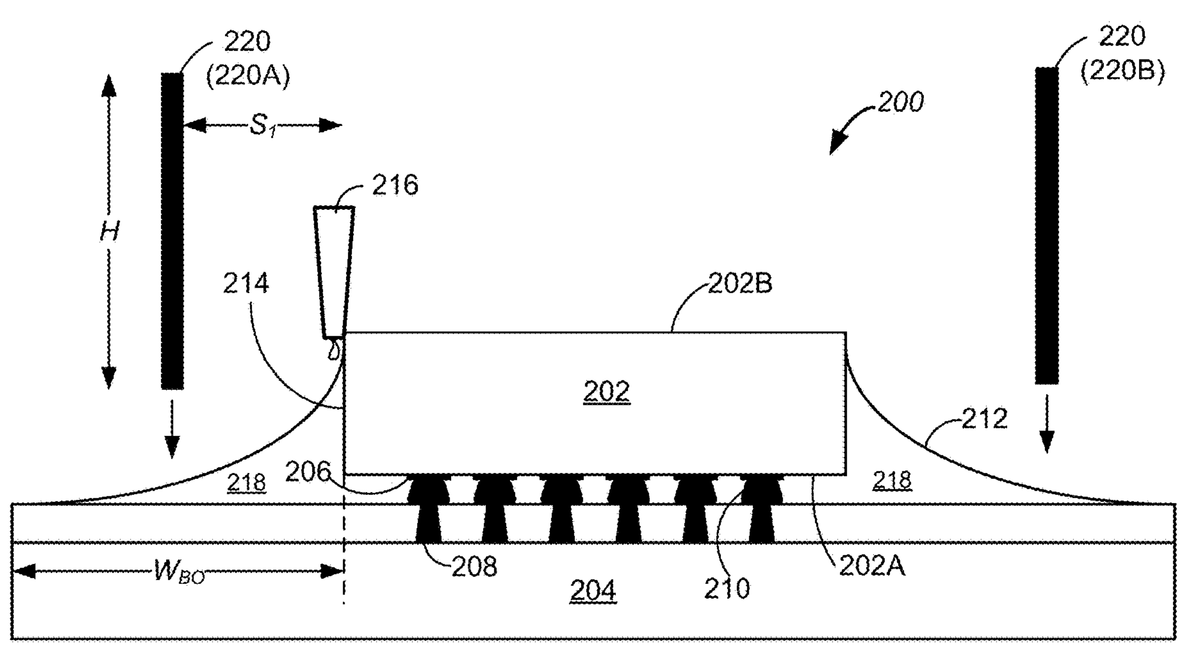
FIG. 2A is a cross-sectional diagram of an example electronic device including two substrates, in accordance with some embodiments.

FIG. 2A is a cross-sectional diagram of an electronic device 200 including two substrates 202 and 204, in accordance with some embodiments. A first substrate 202 is disposed on a support substrate 204 to form a flip chip assembly of the electronic device 200. The first substrate 202 has a first surface 202A and a second surface 202B, and the support substrate 204 has a top surface 204A. One or more first electronic contacts 206 are exposed on the first surface 202A of the first substrate 202. In some embodiments, integrated circuit is formed on the first surface 202A of the first substrate 202. One or more second electronic contacts 208 are exposed on the top surface 204A of the support substrate 204. The first substrate 202 is flipped and coupled to the support substrate 204 with the first surface 202A of the first substrate 202 facing the top surface 204A of the support substrate 204. The one or more first electronic contacts 206 on the first surface 202A are electrical coupled to the one or more second electronic contacts 208 on the top surface 204A of the support surface 204 via one or more conductive connectors 210. In an example, the conductive connectors 210 include solder balls arranged in a ball grid array (BGA).

An underfill material 212 is applied to strengthen electronic connections between the conductive connectors 210 and any of the first and second electronic contacts 206 and 208. In some embodiments, an underfill material 212 includes a composite material made up of an epoxy polymer with significant amounts of filler. Further, in some embodiments, additional components added to the underfill material 212 include one or more of: flow agents, adhesion promoters, and dyes.

The underfill material 212 is applied on or in proximity to a periphery 214 of the first substrate 202 and drops onto the top surface 204A of the support substrate 204. The periphery 214 of the first substrate 202 includes a corner or an edge. In some situations, the underfill material 212 is dispensed by a nozzle 216. The nozzle 216 stops in proximity to the corner of the first substrate 202, and the underfill material 212 having a predefined volume is entirely dispensed on or in proximity to a corner of the first substrate 202. Alternatively, in some situations, the nozzle 216 moves in proximity to at least a portion (e.g., ½) of an edge of the first substrate 202, and the underfill material 212 having the predefined volume is dispensed on or in proximity to at least the portion of the edge of the first substrate 202. Further, in some embodiments, the underfill material 212 is dispensed on or in proximity to one or more edges (e.g., one, one and a half, two, three, and four edges) of the first substrate 202.

In some embodiments, the underfill material 212 automatically spreads across a gap between the first substrate 202 and the support substrate due to capillary action (i.e., surface tension between the underfill material 212 and both of the surfaces 202A and 204A). The underfill material 212 ceases to spread at a distance beyond each edge of the first substrate 202, and is hardened to form a bleed-out region 218 that is in contact with the respective edge of the first substrate 202. The bleed-out region 218 has a bleed-out width $W_{BO}$, which optionally varies with a location on edges of the first substrate 202. In some embodiments, the silicon device 200 is heated to a temperature (e.g., 125° C.-165° C.) to cure the underfill material 212. Once hardened, the underfill material 212 increases resistance against vibration and reduces thermal stress damage, thereby enhancing product reliability and product lifespan of the electronic device 200.

In some embodiments, a bracket structure 220 is placed on the support substrate 204 with a first separation $S_1$ from the first substrate 202, after the first substrate 202 is disposed and before the underfill material 212 is dispensed on a support substrate 204 adjacent to the bracket structure 220A. Referring to FIG. 2A, the underfill material 212 flows in a first direction towards the bracket structure 22A, and stops by the bracket structure 220A to form a raised edge that is in contact with the bracket structure 220A. The underfill material 212 also flows to other directions including a second direction that is opposite to the first direction. Specifically, the underfill material 212 flows between the first substrate 202 and the support substrate 204 and exits from an edge of the first substrate 202B adjacent to the bracket structure 220B. In some situations, the underfill material 212 touches, and is stopped by, the bracket structure 220B to form a raised edge that is in contact with the bracket structure 220B. By these means, the bracket structure 220 automatically controls bleed-out of the underfill material 212 within a respective keep out zone (KOZ) as defined by the bracket structure 220. After the underfill material 212 is substantially hardened, the bracket structure 220 is removed from the support substrate 204, and the bleed-out of the underfill material 212 is controlled based on the KOZ as defined by a location of the bracket structure 220. The KOZ has a width equal to the first separation $S_1$, which is less than the bleed-out width $W_{BO}$. As such, devices in each of the components 102-122 may be closely packaged to reduce a size of the respective component, and a subset of the components 102-122 can also be closely assembled to reduce an overall size of the system module and improve cost efficiency of the system module 100 including the components 102-122.

The bracket structure 220 has a height H that is sufficiently high (e.g., higher than the second surface 202B of the first substrate 202) to avoid overflowing of the underfill material 212 over the bracket structure 220. Conversely, if the height H of the bracket structure 220 is slightly higher than a resulting raised edge of the underfill material 212, the height H needs to increase with a decrease of the first separation $S_1$ to avoid overflowing of the underfill material 212 and effectively control the bleed-out of the underfill material 212.

Additionally, in some embodiments, the bracket structure 220A is disposed in proximity to a side of the first substrate 202A where the underfill material 212 is dispensed. In some embodiments, the bracket structure 220B is disposed in proximity to an exhausting side of the first substrate 202A to which the underfill material 212 spreads after it is dispensed in proximity to a distinct edge of the first substrate 202.

Figure 2B:
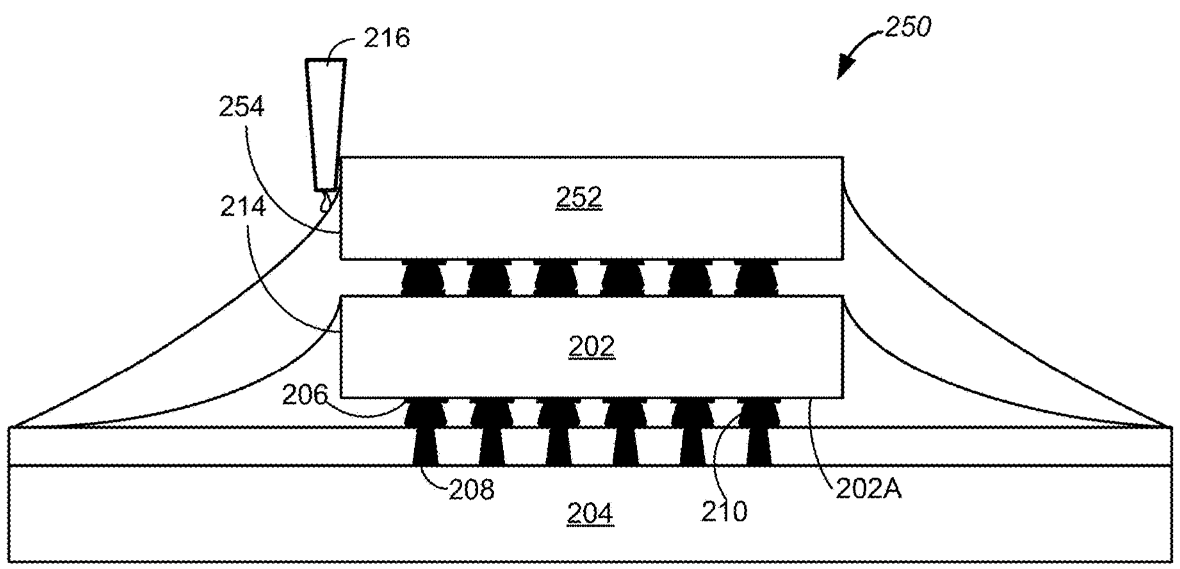
FIG. 2B is a cross-sectional diagram of an example electronic device including more than two substrates, in accordance with some embodiments.

FIG. 2B is a cross-sectional diagram of an electronic device 250 including more than two substrates, in accordance with some embodiments. An underfill material 212 is applied to strengthen electronic connections among more than two substrates of a chip-scale package (CSP). For example, the electronic device 250 includes a second substrate 252 that is coupled to the second surface 202B of the first substrate 202. The underfill material 212 is applied on or in proximity to a periphery of the second substrate 204 and flows to fill both a first gap between the first substrate 202 and the support substrate 204 and a second gap between the first substrate 202 and second substrate 252. In some embodiments, the underfill material 212 is applied by one dispensing operation. The underfill material 212 is applied on or in proximity to a periphery 254 of the second substrate 252. Alternatively, in some embodiments, the underfill material 212 is applied by two dispensing operations. The underfill material 212 is applied on or in proximity to a periphery 214 of the first substrate 202 and fills the first gap between the first substrate 202 and the support substrate 204. Subsequently, the underfill material 212 is applied on or in proximity to a periphery 254 of the second substrate 202 and fills the second gap between the first substrate 202 and the second substrate 204. The electronic device 250 is optionally cured after each dispensing operation or cured only once after both dispensing operations are completed.

Figure 3A:
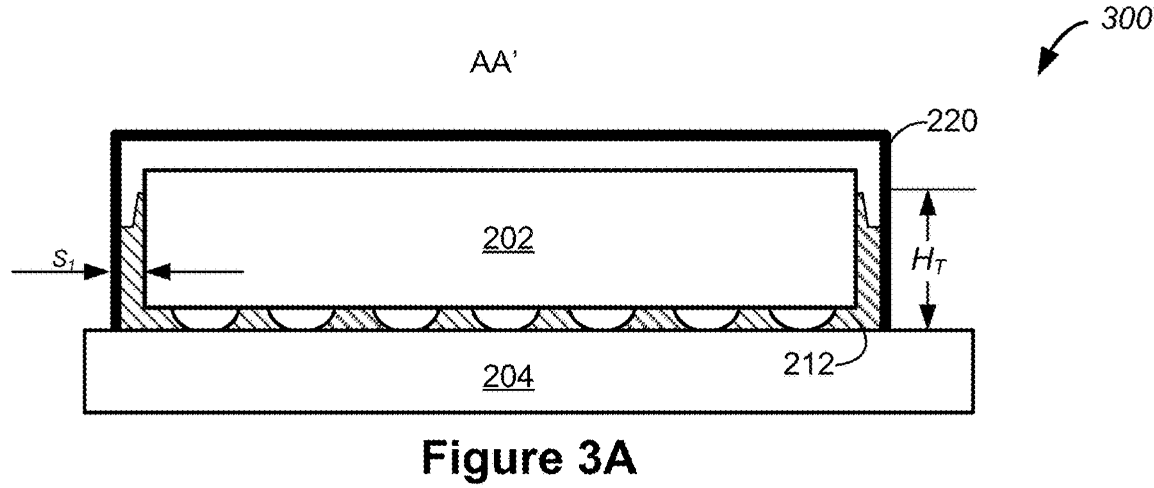
FIG. 3A is a cross-sectional diagram of an example electronic device that is processed to control underfill bleed-out by a bracket structure, in accordance with some embodiments.
Figure 3B:
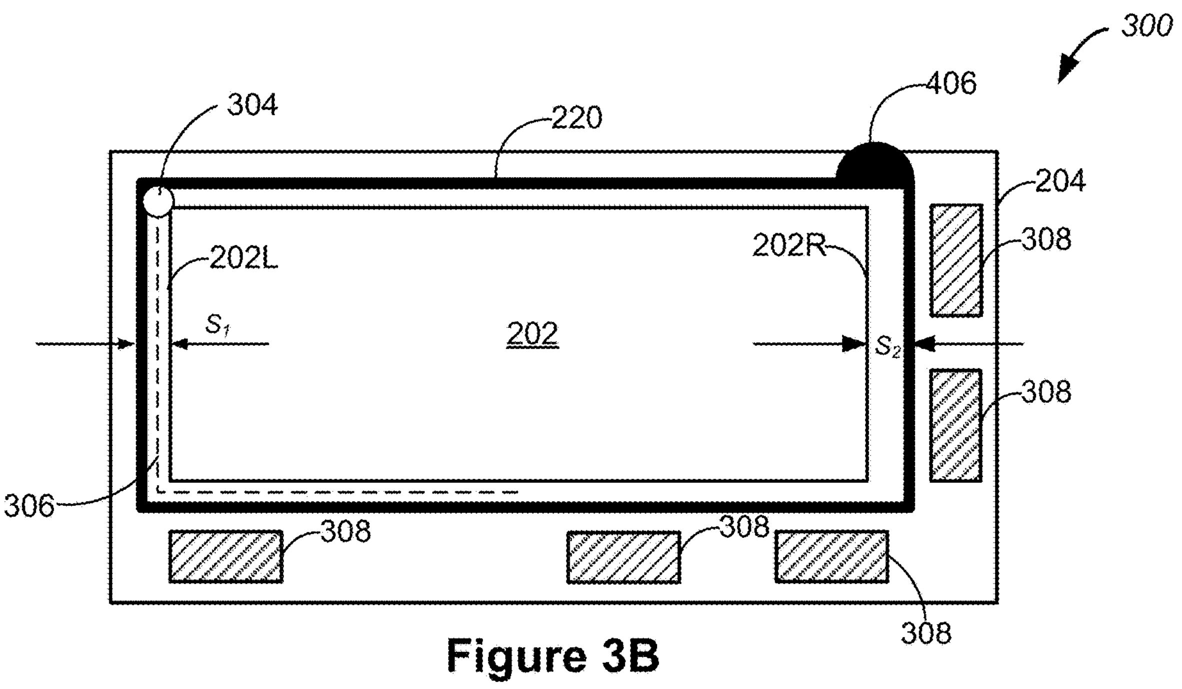
FIGS. 3B and 3C are top views of the example electronic device shown in FIG. 3A, in accordance with some embodiments.
Figure 3C:
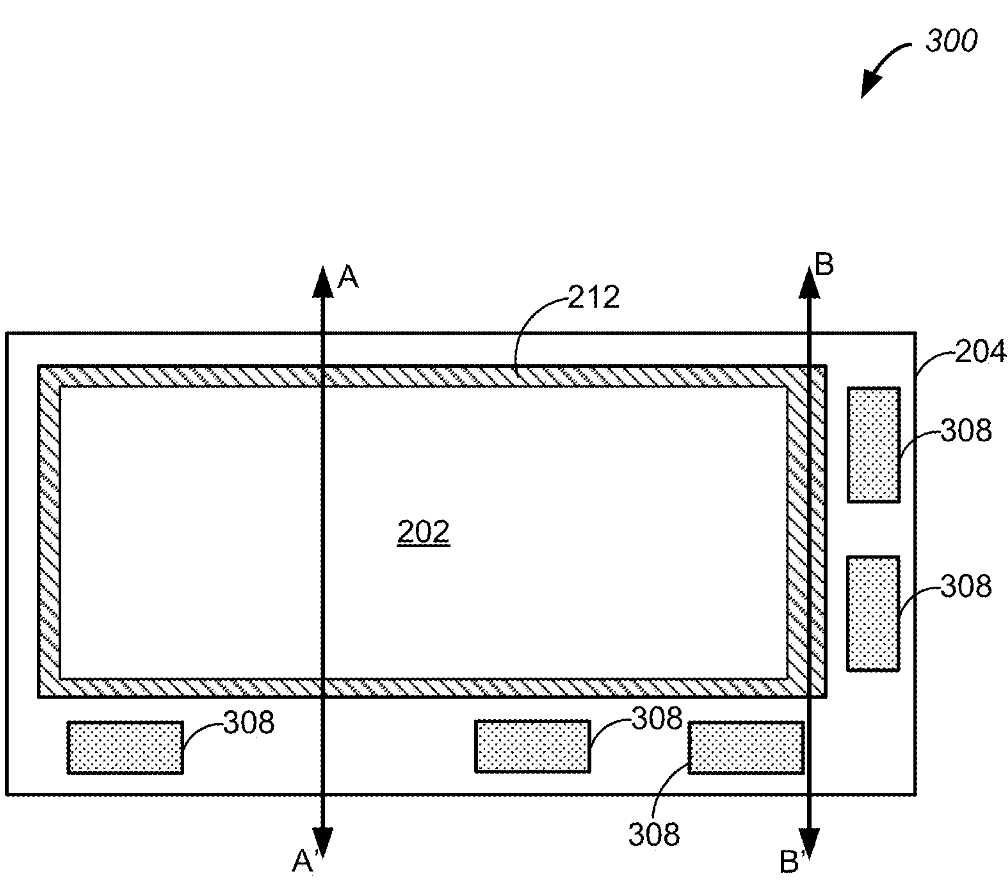

FIG. 3A is a cross-sectional diagram of an example electronic device 300 that is processed to control underfill bleed-out by a bracket structure 220, in accordance with some embodiments. FIGS. 3B and 3C are top views of the example electronic device 300 shown in FIG. 3A, in accordance with some embodiments. The cross-sectional diagram in FIG. 3A corresponds to a cross section AA' in the top view in FIG. 3C. A first substrate 202 is disposed on a support substrate 204, and a bracket structure 220 is placed on the support substrate 204 with a first separation $S_1$ from the first substrate 202 (FIG. 3B). An underfill material 212 is applied on the support substrate 204, e.g., from a corner or at least a portion of one edge of the first substrate 202. The bracket structure 220 automatically controls bleed-out of the underfill material 212 within the first separation $S_1$ (FIGS. 3A and 3B). After the underfill material 212 is hardened, the bracket structure 220 is removed (FIG. 3C). The bracket structure 220 is made from a material that can be easily detached from the underfill material 212. For example, the bracket structure 220 is made of stainless steel.

The first substrate 202 has a plurality of edges (e.g., 4 edges). The bracket structure 220 is placed in proximity to, and has the first separation $S_1$ from, at least a first subset of the plurality of edges (e.g., a left edge 202L) of the first substrate 202. The bracket structure controls bleed-out of the underfill material 212 for the first subset of the plurality of edges of the first substrate 202. In an example, the first subset of the plurality of edges of the first substrate 202 includes all four edges, and the bracket structure 220 includes a rectangular shape. Each side of the bracket structure 220 is separated from a respective side of the first substrate 202 by a respective separation. In some embodiments, the first separation $S_1$ remains identical to the first subset of the plurality of edges of the first substrate 202. Alternatively, in some embodiments, the first separation $S_1$ varies with different locations of the first subset of the plurality of edges of the first substrate 202. For example, the first substrate 202 has a left edge 202L having the first separation $S_1$ with the bracket structure 220, and a right edge 202R having a second separation $S_2$ from the bracket structure 220. The second separation $S_2$ between the bracket structure 220 and the right edge 202R is greater than the first separation $S_1$ between the bracket structure 220 and the left edge 202L. In some embodiments, independently of whether the separation varies with the locations on the bracket structure 220, the first separation $S_1$ (e.g., 0.2 mm) is less than a predefined first separation limit (e.g., 0.5 mm), so is the second separation $S_2$ (e.g., 0.4 mm). The predefined first separation limit is further less than or equal to the bleed-out width $W_{BO}$ (e.g., 1 mm).

The underfill material 212 is applied on or in proximity to a periphery 214 of the first substrate 202. In some situations, the underfill material 212 is dispensed by a nozzle 216 (FIG. 2A) from a fixed corner area 304 between a corner of the first substrate 202 and a corner of the bracket structure 220. The underfill material 212 having a predefined volume is entirely dispensed into the corner area 304 (FIG. 3B), e.g., with a controlled flow. Alternatively, in some situations, the underfill material 212 is dispensed along a path 306 (FIG. 3B) between the first substrate 202 and the bracket structure 220. The path 306 optionally extends in proximity to a portion of an edge, a single edge, or more than one edge (e.g., one and a half edges, two edges, three edges or four edges). While moving along the path 306, the underfill material 212 having the predefined volume is dispensed in the first separation $S_1$ with a controlled flow. In some embodiments not shown, the path 306 forms a closed loop surrounding the first substrate 202. The underfill material 212 is applied to all four edges of the first substrate 202.

In some embodiments, the bracket structure 220 has a height H (FIG. 2A) that is higher than a threshold height $H_T$ configured to control the bleed-out of the underfill material 212. Further, in some embodiments, the threshold height $H_T$ is determined based on the first separation $S_1$ between the first substrate and the bracket structure 220. Referring to FIG. 2A, a height of the bleed-out region 218 gradually drops with a distance from a corresponding edge of the first substrate 202A. The threshold height $H_T$ decreases with an increase of the first separation $S_1$ between the first substrate 202 and the bracket structure 220. Stated another way, the larger the first separation $S_1$, the smaller the threshold height $H_T$. Conversely, the smaller the first separation $S_1$, the larger the threshold height $H_T$. The height of the bracket structure 220 has to be raised to make sure that the underfill material 212 does not overflow beyond the bracket structure 220.

One or more electronic components 308 are disposed on the support substrate 204 jointly with the first substrate 202.

For example, the one or more electronic components 308 include one or more of: a capacitor component, a logic module, a resistor component, and a distinct substrate 202. In some embodiments, the electronic component(s) 308 are off-the-shelf components that are contained in discrete packages. Each of the one or more electronic components 308 keeps a component distance from a closest edge of the first substrate 202. In some embodiments, the underfill material 212 adjacent to an electronic component 308 is controlled by the bracket structure 220, and the corresponding component distance is equal to the separation between the bracket structure 220 and the closest edge of the first substrate 202. Alternatively, in some embodiments, the corresponding component distance is greater than the separation between the bracket structure 220 and the closest edge of the first substrate 202. For example, the component distance is greater than the separation by 0.1 mm.

In some embodiments, the first substrate 202 includes a semiconductor chip, and the support substrate 204 includes a semiconductor package and forms a SiP with the first substrate 202. Alternatively, in some embodiments, the first substrate 202 includes a semiconductor package, and the support substrate 204 includes a PCB. For example, the support substrate 204 is a mother board of a computer machine, and the semiconductor package includes electronic components mounted on the mother board. In some embodiments, the one or more conductive connectors 210 (e.g., solder balls, spring-loaded connectors) are located in a gap between the first substrate 202 and the support substrate 204 or extended beyond edges of the first substrate Alternatively, in some embodiments, the one or more conductive connectors 210 include wires coupled between the second surface 202B of the first substrate 202 and the top surface 204A of the support substrate 204. The one or more conductive connectors 210 are buried in the underfill material 212, independently of whether the bracket structure 312 is applied to control bleed-out of the underfill material 212.

Figures 4A, 4B, 4C:
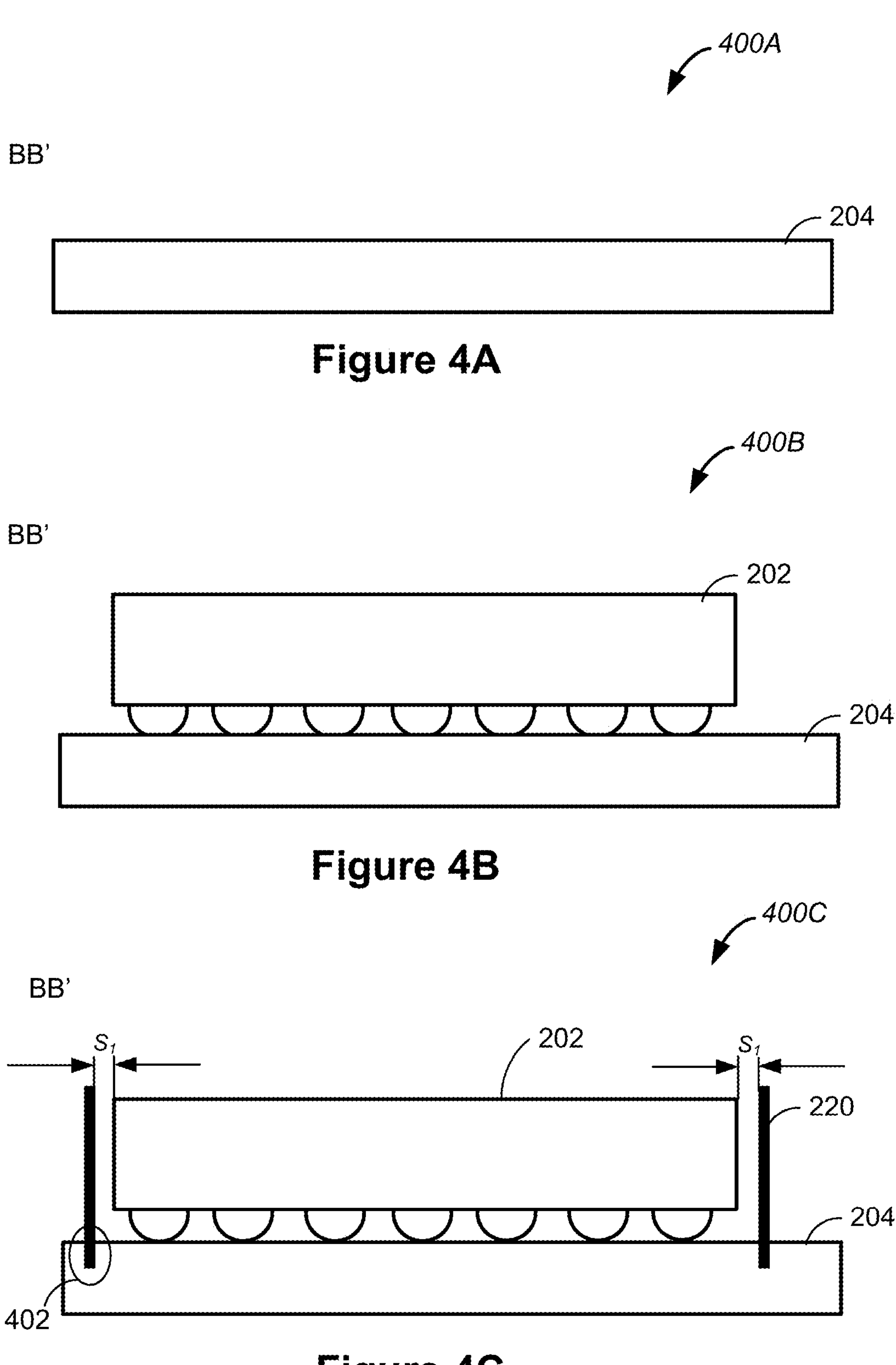
FIGS. 4A-4F illustrate an example process of forming an electronic device in which bleed-out of an underfill material is controlled, in accordance with some embodiments.

FIGS. 4A-4F illustrate an example process 400 (400A-400F) of forming an electronic device 300 in which bleed-out of an underfill material 212 is controlled, in accordance with some embodiments. The process 400 is viewed from a cross section including line B-B' in FIG. 3C. The line B-B' is substantially parallel to a right edge 202L of the first substrate 202 and located between the right edge 202L of the first substrate 202 and the bracket structure 220. Referring to FIG. 4A (400A), a support substrate 204 is applied to make the electronic device 300. In some embodiments, the support substrate 204 is made of one of: PCB, ceramic, glass, polymer, silicon, and other semiconductor materials. Referring to FIG. 4B (400B), a first substrate 202 is disposed on the support substrate 204. The first substrate 202 has a first surface 202A and a second surface 202B, and the support substrate 204 has a top surface 204A. One or more first electronic contacts 206 are exposed on the first surface 202A of the first substrate 202. In some embodiments, integrated circuit is formed on the first surface 202A of the first substrate 202. The one or more second electronic contacts 208 are exposed on the top surface 204A of the support substrate 204. The first substrate 202 is flipped and coupled to the support substrate 204 with the first surface 202A of the first substrate 202 facing the top surface 204A of the support substrate 204. The one or more first electronic contacts 206 on the first surface 202A are electrical coupled to the one or more second electronic contacts 208 on the top surface 204A of the support surface 204 via one or more conductive connectors 210.

Referring to FIG. 4C (400C), a bracket structure 220 is disposed on the support substrate 204. The first substrate 202 has a plurality of edges (e.g., 4 edges). The bracket structure 220 is placed in proximity to, and has a first separation $S_1$ from at least one of the plurality of edges of the first substrate 202. In some embodiments (FIG. 3B), the bracket structure 220 has the first separation $S_1$ and a second separation $S_2$ from a left edge 202L and a right edge 202R of the first substrate 202, respectively. The second separation $S_2$ is greater than the first separation $S_1$. In some embodiments, the bracket structure 220 is held onto the support substrate 204 with an external force, e.g., a clamp. Alternatively, in some embodiments, an adhesive is applied at a plurality of spots, a subset, or an entirety of a bottom surface of the bracket structure 220, and the bracket structure 220 is held onto the support substrate 204 by the adhesive. Alternatively, in some embodiments, the bracket structure 220 is held onto the support substrate 204 using a fastening structure 402. For example, the support substrate 204 has open slots 402 configured to receive and hold the bracket structure 220. Any of the external force, the adhesive, and the fastening structure 402 can be easily disabled to remove the bracket structure 220 from the support substrate 204 if needed.

Figure 4D:
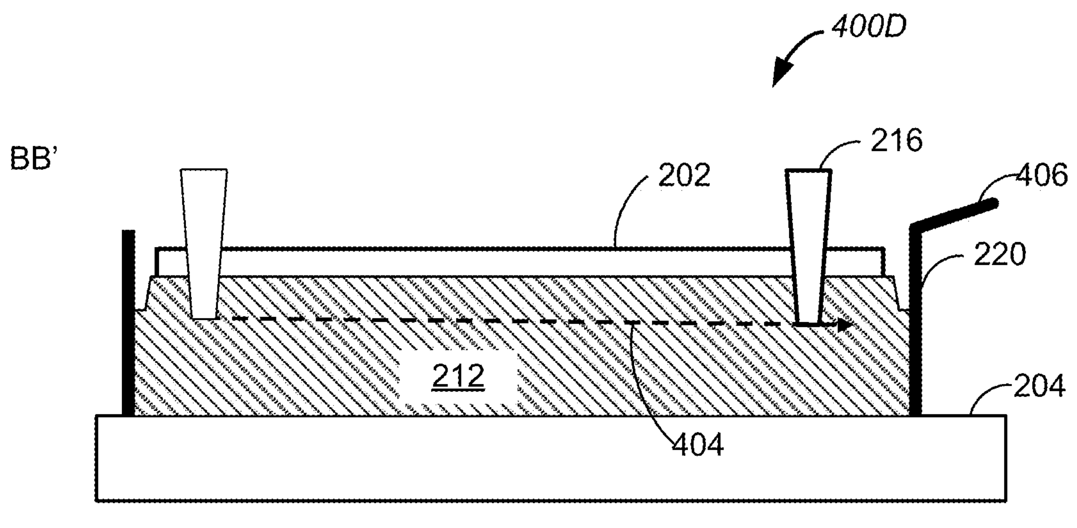

Referring to FIG. 4D, a nozzle 216 moves along a path 404 and dispenses the underfill material 212 in the second separation $S_2$ between the bracket structure 220 and the right edge 202R of the first substrate 202. Three remaining edges 202L, 202T, and 202M correspond to exhaust sides of the first substrate 202 to which the underfill material 212 spreads or diffuses. In some embodiments, a first portion of the bracket structure 220 where the underfill material 212 is dispensed has a dispensing structure height, and a second portion of the bracket structure 220 corresponds to the exhaust sides of the substrate 202 and has an exhausting structure height. The dispensing structure height is greater than the exhausting structure height. Alternatively, in some embodiments, the dispensing structure height and the exhausting structure height are identical.

The underfill material 212 is cured, e.g., using heat treatment. In some embodiments, the bracket structure 220 is left on the support substrate 204 after the underfill material 212 is hardened. Alternatively, in some embodiments, the bracket structure 220 is removed from the support substrate 204 after the underfill material 212 is hardened. Additionally, in some embodiments, the bracket structure 220 includes a handling structure 406 (FIGS. 3B and 4D) configured to facilitate removing the bracket structure 220 from the support substrate 204 after the underfill material 212 is substantially hardened.

Figure 4E:
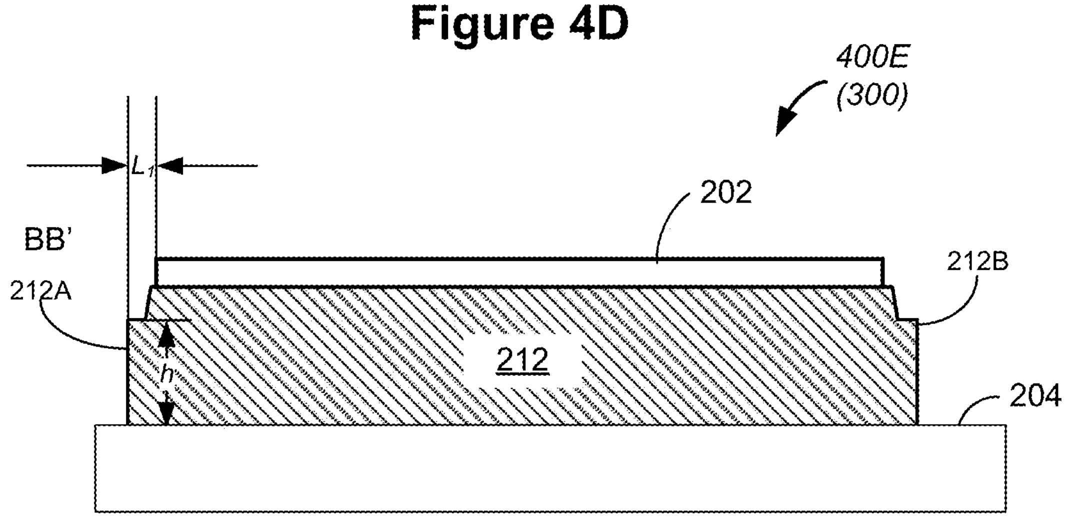

Referring to FIG. 4E, after the bracket structure 220 is removed, the underfill material 212 fills a gap between the first substrate 202 and the support substrate 204, and extends beyond edges of the first substrate 202. In some embodiments, the bracket structure 220 is disposed on the support substrate 204 and in proximity to a first subset of the edges of the first substrate 202. If the underfill material 212 is disposed in proximity to the first subset of the edges, the underfill material 212 has a controlled dispensing height ($h_1$) at a separation (e.g., $S_1$) defined by the bracket structure 220. If the underfill material 212 is not disposed in proximity to the first subset of the edges, the underfill material 212 has a controlled exhausting height ($h_2$) at the separation (e.g., $S_1$) defined by the bracket structure 220. The controlled dispensing height ($h_1$) of the underfill material 212 is greater than the controlled exhausting height ($h_2$). In some embodiments, the bracket structure 220 is disposed on the support substrate 204, but not in proximity to a second subset of the edges of the first substrate 202. Regardless of whether the underfill material 212 is disposed in proximity to the second subset of the edges, the second subset of the edges corresponds to a bleed-out region 218 in which the underfill material 212 drops from an initial height to zero (FIG. 2). A bleed-out width $W_{BO}$ is greater than the corresponding separation between the bracket structure 220 and the first substrate 202. By these means, the bracket structure 220 controls the bleed-out width $W_{BO}$ of the bleed-out region 218 down to the corresponding separation (e.g., the first separation $S_1$) between the bracket structure 220 and the first substrate 202.

In other words, after the bracket structure 220 is removed, at least a portion of the underfill material 212 defined by the bracket structure 220 has a raised edge 212A at a first distance $L_E$ from the first substrate 202. The first distance $L_1$ is defined by the first separation $S_1$ between the bracket structure 220 and a corresponding edge of the first substrate 202. In some embodiments, the height h of the raised edge 212A of the underfill material 212 is determined based on a corresponding separation $S_1$ between the first substrate and the bracket structure 220. Specifically, the height h of the raised edge 212A of the underfill material 212 decreases with an increase of the separation between the first substrate 202 and the bracket structure 220. Stated another way, the larger the separation $S_1$, the smaller the height h of the raised edge 212A of the underfill material 212. Conversely, the smaller the separation $S_1$, the larger the height h of the raised edge 212A of the underfill material 212. Additionally, in some embodiments, the height h of the raised edge 212A includes a controlled dispensing height ($h_1$) or an exhausting height ($h_2$) depending on whether the underfill material 212 is dispensed in proximity to the raised edge 212A.

Figure 4F:
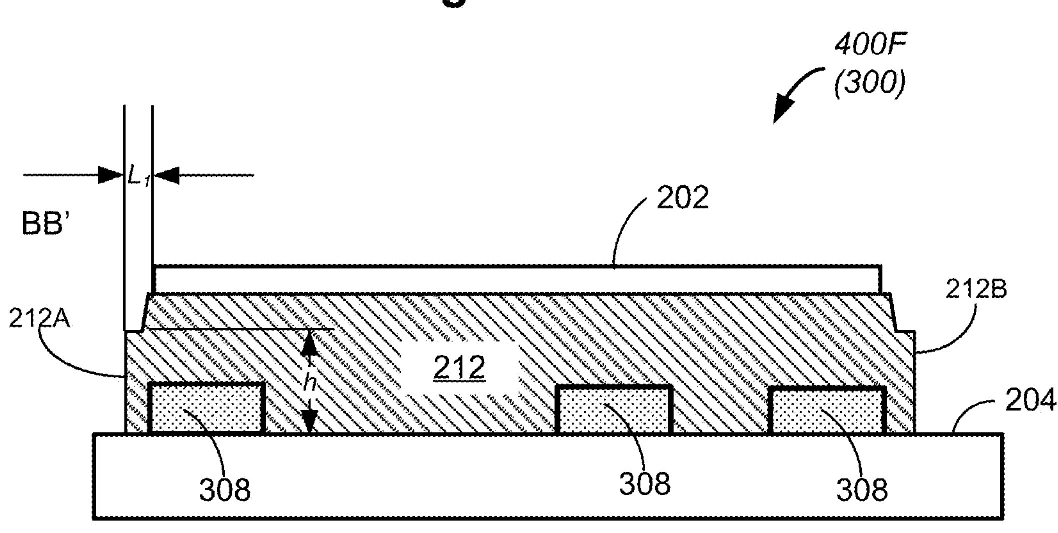

Referring to FIG. 4F, electronic components 318 are disposed external to the underfill material 211 that couples the first substrate 202 and the support substrate 204. Compared with a bleed-out region 218 (FIG. 2A), a separation between each electronic component 318 and the first substrate 202 is reduced when the bracket structure 220 is applied, e.g., from the bleed-out width $W_{BO}$ to the first separation $S_1$, thereby enhancing a device density and cost effectiveness of the electronic device 300. In some embodiments, the electronic components 318 are disposed on the support substrate 204, before the bracket structure 220 is disposed and the underfill material 212 is applied. In some embodiments, the electronic components 318 are disposed on the support substrate 204, after the bracket structure 220 is disposed and before the underfill material 212 is applied. In some embodiments, the electronic components 318 are disposed on the support substrate 204, after the underfill material 212 is applied and before the bracket structure 220 is removed. In some embodiments, the electronic components 318 are disposed on the support substrate 204, after the bracket structure 220 is removed.

Figure 5A:
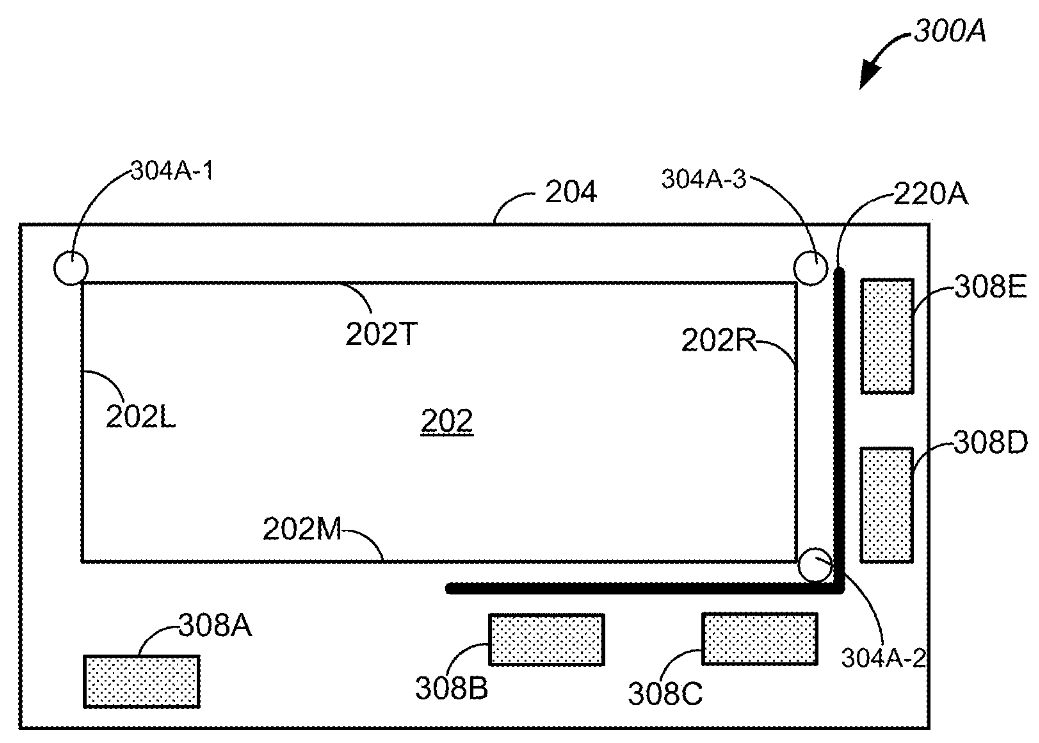
FIGS. 5A-5C are top views of example electronic devices for which underfill bleed-out is controlled by bracket structures, in accordance with some embodiments.
Figure 5B:
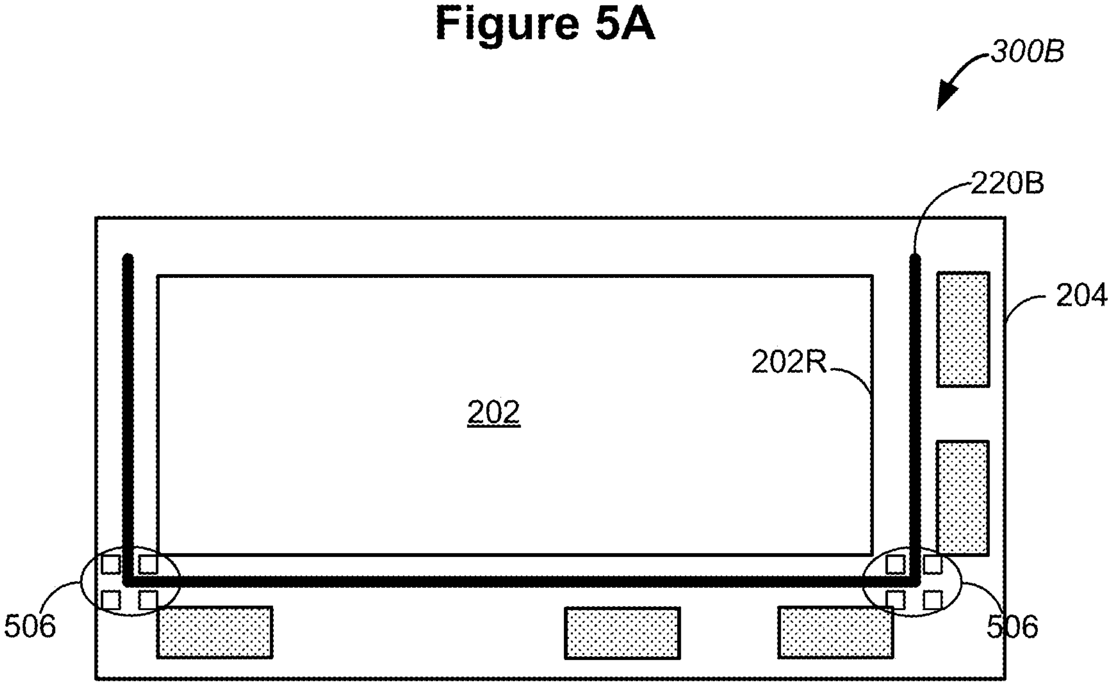
Figure 5C:
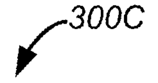
Figure 5C:
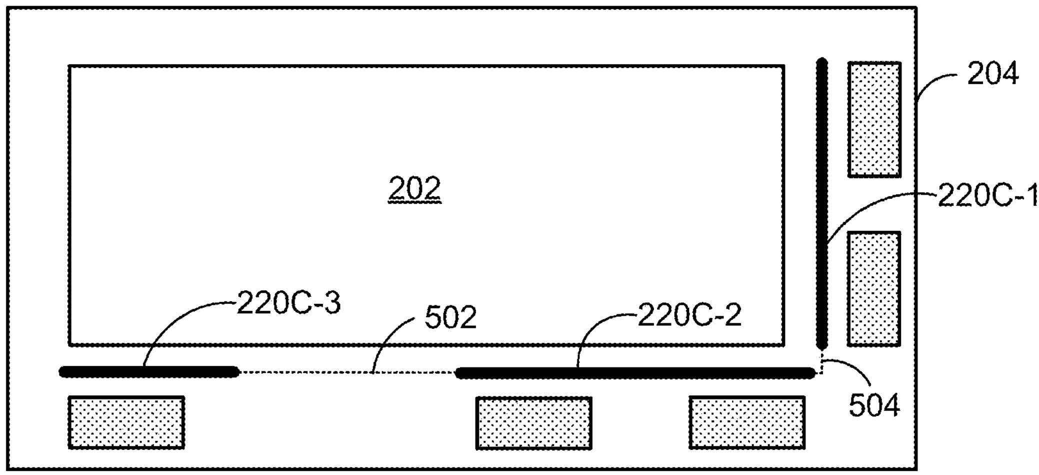

FIGS. 5A-5C are top views of electronic devices 300A, 300B, and 300C for which underfill bleed-out is controlled by distinct bracket structures 220A, 220B, and 220C, in accordance with some embodiments, respectively. The first substrate 202 has a plurality of edges (e.g., 4 edges). The bracket structure 220 is placed in proximity to, and has the first separation $S_1$ from, at least a first subset of the plurality of edges of the first substrate 202. The bracket structure controls bleed-out of the underfill material for the first subset of the plurality of edges of the first substrate. Referring to FIG. 5A, the bracket structure 220A extends along one and a half edges of the first substrate 202. A subset of electronic components 308 (e.g., 308B-308E) are disposed in proximity to the one and a half edges of the first substrate 202. Referring to FIG. 5B, the bracket structure 220B extends along full lengths of three edges of the first substrate 202, while the electronic components 308A-308E are disposed in proximity to two of these three edges.

Referring to FIG. 5C, the bracket structure 220C includes three discrete portions 220C-1, 220C-2, and 220C-3 selectively disposed in proximity to a subset of edges near which electronic components have been or will be placed. In some embodiments, the three portions 220C-1, 220C-2, 220C-3 are separate from one another and individually placed on the support substrate 204. Alternatively, in some embodiments, the three portions 220C-1, 220C-2, and 220C-3 are mechanically coupled to one other on the bracket structure 220C, e.g., at a height that is above the second surface 202B of the first substrate 202. Spaces 502 and 504 among the three portions 220C-1, 220C-2, and 220C-3 are left open on the top surface 204A of the support substrate 204, allowing the underfill material 212 to bleed out naturally. The underfill material 212 spreads to form a bleed-out width $W_{BO}$ corresponding to each of the spaces 502 and 504, while being limited within the first separation $S_1$ where the three portions 220C-1, 220C-1, and 220-3 of the bracket structure 220 are disposed.

In some embodiments, the underfill material 212 is applied to the first subset of the plurality of edges of the first substrate 202. For example, referring to FIG. 5C, the underfill material 212 is applied to portions of the edges of the first substrate 202 facing the three portions 220C-1, 220C-2, and 220C-3 of the bracket structure 220.

In some embodiments, the underfill material 212 is applied to at least a second subset of the plurality of edges of the first substrate 202, and the second subset of the plurality of edges is distinct from, and has no overlap with, the first subset of the plurality of edges where the bracket structure 220 is disposed in proximity. For example, referring to FIG. 5A, the second subset of the plurality of edges of the first substrate 202 includes a right edge 212R. In another example, the underfill material 212 is applied in the corner area 304A-1 corresponding to a top left corner of the first substrate 202 where no bracket structure 220 is applied to control bleed-out. Stated another way, in some embodiments, the bracket structure 220 is placed in proximity to a right edge 202R of the first substrate 202, and controls bleed-out of the underfill material 212 for the right edge 202R of the first substrate 202. The underfill material 212 is applied to at least one of a corner (e.g., near the corner area 304A-1), the right edge 202R, and a left edge 202L of the first substrate 202. The left edge 202L is distinct from the right edge 202R. Further, in some embodiments, the bracket structure 220 does not extend in proximity to a top edge 202T of the first substrate 202. The top edge 202T is distinct from the right edge 202R. After the underfill material 212 is applied and hardened, the underfill material 212 extends beyond the top edge 202T by a bleed-out width $W_{BO}$. The bleed-out width $W_{BO}$ is greater than the separation of the bracket structure 220 from the first substrate 202.

In an example (e.g., FIG. 5A), the underfill material 212 has a dispense side near the left edge (202L) or top edge (202T) that is not associated with the bracket structure 220, and the dispense side has a first width (e.g., 1 mm) beyond the left edge (202L) or top edge (202T). Conversely, the underfill material 212 has a bleed-out side near the right edge 202R that is associated with the bracket structure 220C-1, and the dispense side has a second width (e.g., 0.1 mm) beyond the right edge 202R. The first width is greater than the second width.

Alternatively, in some embodiments, the underfill material 212 is applied to at least a second subset of the plurality of edges of the first substrate 202, and the second subset of the plurality of edges is distinct from, and partially overlaps, the first subset of the plurality of edges where the bracket structure 220 is disposed in proximity. For example, referring to FIG. 5A, the second subset of the plurality of edges of the first substrate 202 includes a bottom edge 212M, and the underfill material 212 is dispensed on a first half of the bottom edge 212M without being limited by any bracket structure 220. The underfill material 212 is also dispensed on a second half of the bottom edge 212M while being limited by the bracket structure 220A. In another example, the underfill material 212 is applied in the corner area 304A-2 or 304A-3 corresponding to a corner of the first substrate 202 and part of the bracket structure 220A.

One or more electronic components 308 are disposed on the support substrate 204 jointly with the first substrate 202. For example, the one or more electronic components 308 include one or more of: a capacitor component, a logic module, a resistor component, and a distinct substrate 202. Each of the one or more electronic components 308 keeps a component distance from a closest edge of the first substrate 202. In some embodiments, the underfill material 212 adjacent to an electronic component 308 is controlled by the bracket structure 220, and the corresponding component distance is equal to or greater than the separation between the bracket structure 220 and the closest edge of the first substrate 202. Alternatively, in some embodiments (FIG. 5A), the underfill material 212 adjacent to an electronic component 308A is not controlled by any bracket structure 220, and the corresponding component distance is equal to or greater than the bleed-out width $W_{BO}$, which is greater than the separation between the bracket structure 220 and the first substrate 202. The electronic component 308A is disposed further away from the first substrate 202A than other electronic component 308B-308E (FIG. 5A).

Referring to FIG. 5B, in some embodiments, a top surface 204A of the support substrate 204 includes a plurality of alignment marks 506. When the bracket structure is placed on the support substrate 204, the bracket structure 220 is aligned with the plurality of alignment marks 506 on the top surface 204A of the support substrate 204.

Figure 6A:
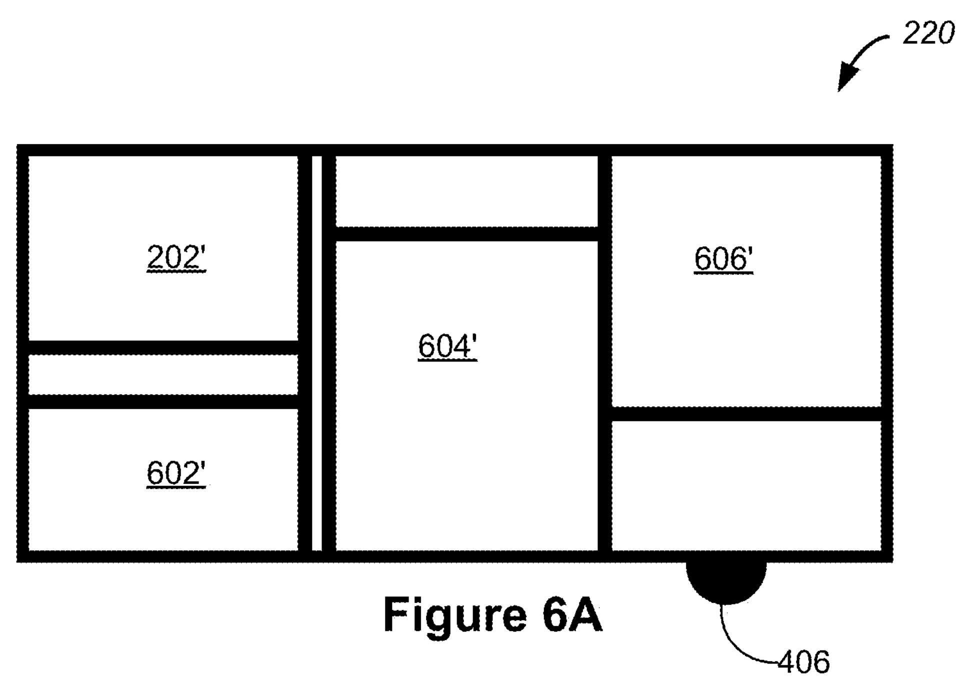
FIG. 6A is a top view of an example bracket structure, in accordance with some embodiments.
Figure 6B:
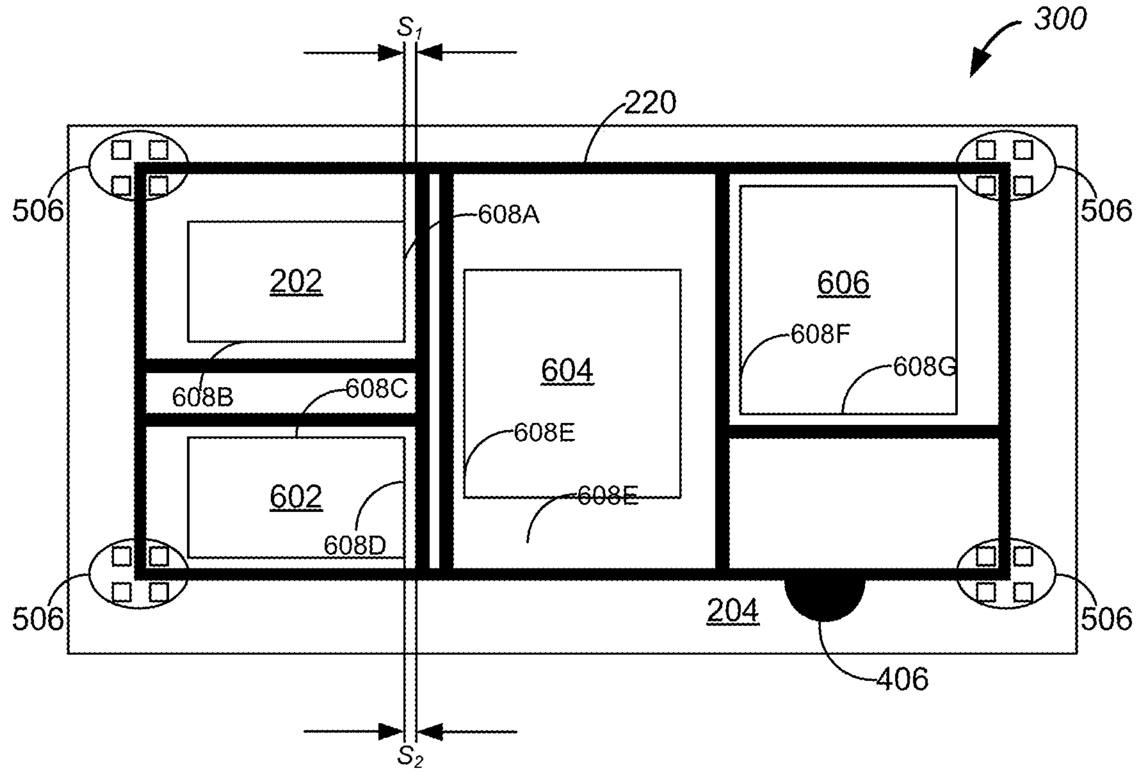
FIGS. 6B and 6C are top views of an example electronic device for which underfill bleed-out is controlled by a bracket structure, in accordance with some embodiments.
Figure 6C:
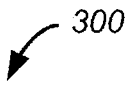
Figure 6C:
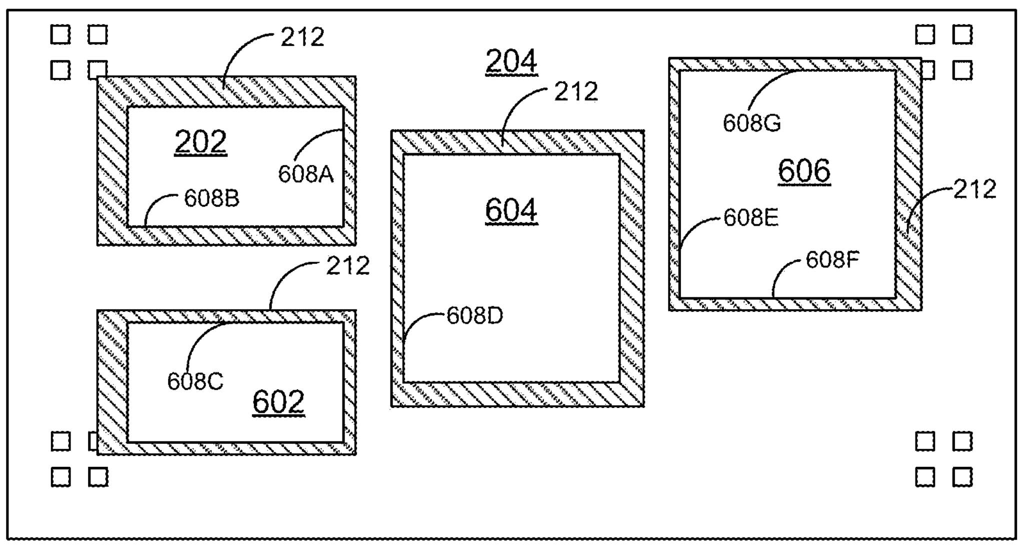

FIG. 6A is a top view of a bracket structure 312, in accordance with some embodiments. FIGS. 6B and 6C are top views of an electronic device 300 for which underfill bleed-out is controlled by a bracket structure 312, in accordance with some embodiments. A plurality of substrates include a first substrate 202, a second substrate 602, a third substrate 604, and a fourth substrate 606. Each of the plurality of substrates is disposed on a respective location of a support substrate 204. In some embodiments, in accordance with locations of electronic components 318 to be disposed in proximity to the plurality of substrates, a plurality of control edges 608 of the plurality of substrates are selected for bleed-out controlling. In some embodiments, a single bracket structure 312 is designed based on the locations of the plurality of substrates on the support substrate 204 and the plurality of control edges 608. Stated another way, the single bracket structure 312 includes at least four openings 202', 602', 604', and 606' configured to accommodate the substrates 202, 602, 604, and 606, respectively.

The bracket structure 312 has a respective separation S from each of the plurality of control edges 608 (e.g., 608A-608G). In some embodiments, the respective separations of the bracket structure 312 from the plurality of control edges 608 are identical. Alternatively, in some embodiments, at least two separations of the bracket structure 220 and the plurality of control edges 608 are distinct from each other. The underfill material 212 is applied sequentially to, or in proximity to, peripheries of the plurality of substrates. Bleed-out of the underfill material under different substrates 202 and 602-606 are controlled automatically by the bracket structure 220. Specifically, the underfill material 212 extends beyond the plurality of control edges 608 based on the separations defined between the bracket structure 220 and the plurality of control edges 608. Remaining edges of the substrates 202 and 602-606 are complementary to the plurality of control edges 608, and correspond to blead-out regions 218 that have a bleed-out width $W_{BO}$ without being controlled by the bracket structure 220. After the underfill material 212 is hardened, the bracket structure 220 is removed from the support substrate 204, and bleed-out next to the plurality of control edges 608 is controlled in accordance with the bracket structure 220.

Referring to FIG. 6B, in some embodiments, a top surface 204A of the support substrate 204 includes a plurality of alignment marks 506. When the bracket structure 220 is placed on the support substrate 204, the bracket structure 220 is aligned with the plurality of alignment marks on the top surface 204A of the support substrate 204, and internal structures of the bracket structure 220 are automatically aligned with the substrates 202 and 602-606.

FIG. 7 is a flow diagram of an example method 700 of controlling underfill bleed-out in an electronic device 300, in accordance with some embodiments. The method 700 is implemented to manufacture the electronic device 300 including a first substrate 202 and a support substrate 204 (FIGS. 3C, 4E, and 4F). The first substrate 202 is disposed (operation 702) on the support substrate 204. A bracket structure 220 is placed (operation 704) on the support substrate 204 with a first separation $S_1$ from the first substrate 202. An underfill material 212 is applied (operation 706) on the support substrate 204. At least a portion of the underfill material 212 has a raised edge 212A (FIGS. 4E and 4F) at a first distance $L_1$ (e.g., equal to the first separation $S_1$) from the first substrate 202. The bracket structure 220 automatically controls (operation 708) bleed-out of the underfill material 212. In some embodiments, in accordance with a determination that the underfill material 212 is substantially hardened, the bracket structure 220 is removed (operation 710) from the support substrate 204.

In some embodiments, while the first substrate 202 is disposed on the support substrate 204, the first substrate 202 is electrically coupled (operation 712) to the support substrate 204 via one or more conductive connectors 210 located between opposing surfaces 202A and 204A of the first substrate 202 and the support substrate 204.

In some embodiments, the first substrate 202 has a plurality of edges, and the bracket structure 220 is placed in proximity to, and has the first separation $S_1$ from, at least a first subset of the plurality of edges of the first substrate 202. The bracket structure 220 controls bleed-out of the underfill material 212 for the first subset of the plurality of edges of the first substrate 202. Examples of the first subset of the plurality of edges include, but are not limited to, a portion (e.g., ½) of an edge, one edge, one and a half edges (FIG. 5A), two edges, three edges (FIG. 5B), four edges, distributed portions of edges (FIG. 5C), or a combination thereof. The bracket structure 220 optionally includes a single piece of structure or a set of unconnected structures for controlling bleed-out of the underfill material 212 the first subset of the plurality of edges of the first substrate 202. Further, in some embodiments, the first separation $S_1$ is less than a predefined first separation limit (e.g., 1 mm).

Additionally, in some embodiments, the underfill material 212 is applied to at least a second subset of the plurality of edges of the first substrate 202, and the second subset of the plurality of edges is distinct from, and has no overlap with, the first subset of the plurality of edges. Alternatively, in some embodiments, the underfill material 212 is applied to at least a second subset of the plurality of edges of the first substrate 202, and the second subset of the plurality of edges is distinct from, and partially overlaps, the first subset of the plurality of edges. In an example, the underfill material 212 is applied to the first subset of the plurality of edges of the first substrate 202.

In some embodiments, at least a portion of the bracket structure 220 is placed in proximity to the first subset of the plurality of edges of the first substrate 202, and at least the portion of the bracket structure 220 has a height H greater than a threshold height $H_T$ associated with the first separation $S_1$. The larger the first separation $S_1$, the smaller the threshold height $H_T$. Conversely, the smaller the first separation $S_1$, the larger the threshold height $H_T$, because the height H of the bracket structure 220 needs be raised to make sure that the underfill material 212 does not overflow beyond the bracket structure 220.

In some embodiments (FIG. 5A), the bracket structure 220 is placed (operation 714) in proximity to, and has the first separation $S_1$ from, a first edge (e.g., a right edge 202R) of the first substrate 202, and controls bleed-out of the underfill material 212 for the first edge of the first substrate 202. The underfill material 212 is applied (operation 716) to at least one of a corner (e.g., 304A-1), the first edge, and a second edge (e.g., a left edge 202L) of the first substrate 202. The second edge is distinct from the first edge. Further, in some embodiments (FIG. 5A), the bracket structure 220 does not extend (operation 718) in proximity to a third edge (e.g., a top edge 202T) of the first substrate 202, and the third edge is distinct from the first edge. After the underfill material 212 is applied and hardened, the underfill material 212 extends beyond the third edge by a bleed-out width $W_{BO}$. The bleed-out width $W_{BO}$ is greater (operation 720) than the first separation $S_1$ of the bracket structure 220 from the first substrate 202.

In some embodiments (FIG. 3B), the bracket structure 220 is placed in proximity to a first edge and a second edge of the first substrate 202, and controls bleed-out of the underfill material 212 along the first and second edges of the first substrate 202. The bracket structure 220 has the first separation $S_1$ from the first edge (e.g., a left edge 202L in FIG. 3B) and a second separation $S_2$ from the second edge (e.g., a right edge 202R in FIG. 3B), and the second separation $S_2$ is greater than the first separation $S_1$.

In some embodiments, the first substrate 202 includes (operation 722) a semiconductor package, and the support substrate 204 includes a printed circuit board (PCB). In some embodiments, the first substrate 202 includes (operation 724) a semiconductor chip, and the support substrate 204 includes a semiconductor package and forms a system in a package (SiP) with the first substrate 202.

In some embodiments (FIG. 6B), a second substrate 602 is disposed on the support substrate 204. The bracket structure 220 extends in proximity to the second substrate 602 and has a second separation $S_2$ from the second substrate 602. After the first and second substrates 202 and 602 are disposed, the underfill material 212 is applied sequentially to the first substrate 202 and the second substrate 602. Bleed-out of the underfill material 212 under the second substrate 602 is automatically controlled by the bracket structure 220.

In some embodiments, a top surface 204A of the support substrate 204 includes an alignment mark 506 (FIGS. 5B and 6B). The first substrate 202 is placed on the support substrate 204 by aligning the bracket structure 220 with the alignment mark 506 on the top surface of the support substrate 204 and holding the bracket structure 220 onto the support substrate 204 with a fastening structure (e.g., an open slot 402 in FIG. 4C), an adhesive, or an external force.

In some embodiments, the bracket structure 220 has a portion configured to facilitate removing the bracket structure 220 from the support substrate 204 after the underfill material 212 is substantially hardened.

In some embodiments, the bracket structure 220 is made of stainless steel. In some embodiments, the bracket structure 220 is made of any other suitable materials.

It should be understood that the particular order in which the operations in FIG. 8 have been described are merely exemplary and are not intended to indicate that the described order is the only order in which the operations could be performed. One of ordinary skill in the art would recognize various ways to control bleed-out of an underfill material 212 under a substrate. Additionally, it should be noted that details of other processes described above with respect to FIGS. 1-7 are also applicable in an analogous manner to method 800 described above with respect to FIG. 8. For brevity, these details are not repeated here.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method for controlling underfill bleed-out, comprising:

disposing a first substrate on a support substrate;

disposing a second substrate on the support substrate;

placing, on the support substrate, a bracket structure including a first opening and a second opening, wherein after the bracket structure is placed on the support substrate, the first substrate is located in the first opening having a first separation from the first substrate, and the second substrate is located within the second opening;

applying an underfill material on the support substrate; and automatically controlling bleed-out of the underfill material by the bracket structure.

2. The method of claim 1, further comprising:

in accordance with a determination that the underfill material is substantially hardened, removing the bracket structure from the support substrate.

3. The method of claim 1, wherein:

the first substrate has a plurality of edges;

the bracket structure is placed in proximity to, and has the first separation from, at least a first subset of the plurality of edges of the first substrate; and the bracket structure controls bleed-out of the underfill material for the first subset of the plurality of edges of the first substrate.

4. The method of claim 3, wherein the underfill material is applied to at least a second subset of the plurality of edges of the first substrate, and the second subset of the plurality of edges is distinct from, and has no overlap with, the first subset of the plurality of edges.

5. The method of claim 3, wherein the underfill material is applied to at least a second subset of the plurality of edges of the first substrate, and the second subset of the plurality of edges is distinct from, and partially overlaps, the first subset of the plurality of edges.

6. The method of claim 3, wherein the underfill material is applied to the first subset of the plurality of edges of the first substrate, and wherein at least a portion of the bracket structure is placed in proximity to the first subset of the plurality of edges of the first substrate, and at least the portion of the bracket structure has a height greater than a threshold height associated with the first separation.

7. The method of claim 1, wherein:

the bracket structure is placed in proximity to, and has the first separation from, a first edge of the first substrate, and controls bleed-out of the underfill material for the first edge of the first substrate; and the underfill material is applied to at least one of a corner, the first edge, and a second edge of the first substrate, the second edge distinct from the first edge.

8. The method of claim 1, wherein:

the bracket structure is placed in proximity to a first edge and a second edge of the first substrate, and controls bleed-out of the underfill material along the first and second edges of the first substrate; and the bracket structure has the first separation from the first edge and a second separation from the second edge, and the second separation greater than the first separation.

9. The method of claim 1, wherein placing, on the support substrate, the bracket structure further comprises holding the bracket structure onto the support substrate with a fastening structure.

10. The method of claim 1, wherein the bracket structure has a portion that is protruded from a straight edge to facilitate removing the bracket structure from the support substrate after the underfill material is substantially hardened.

11. The method of claim 1, wherein a top surface the support substrate includes an alignment mark, the method further comprising:

aligning the bracket structure with the top surface of the support substrate using the alignment mark.

12. An electronic device, comprising:

a support substrate;

a first substrate disposed on the support substrate;

a second substrate disposed on the support substrate; and an underfill material applied (1) between the support substrate and the first substrate and (2) between the support substrate and the second substrate, wherein at least a first portion of the underfill material has a first raised edge at a first distance from the first substrate;

wherein the underfill material further includes a second portion, and the second portion has a second raised edge at a second distance from the first substrate; and wherein the first distance is greater than the second distance, and the first raised edge is lower than the second raised edge.

13. The electronic device of claim 12, wherein the first substrate is electrically coupled to the support substrate via one or more conductive connectors located between opposing surfaces of the first substrate and the support substrate.

14. The electronic device of claim 12, wherein:

the first substrate has a plurality of edges; and the underfill material is located in proximity to at least a portion of an edge, an edge, two edges, three edges, or four edges of the plurality of edges of the first substrate.

15. The electronic device of claim 14, wherein the first distance is less than a predefined first separation limit.

16. The electronic device of claim 12, wherein the first substrate includes a semiconductor package, and the support substrate includes a printed circuit board (PCB).

17. The electronic device of claim 12, wherein the first substrate includes a chip, and the support substrate includes a semiconductor package and forms a system in a package (SiP) with the first substrate.

18. The electronic device of claim 12, wherein the underfill material has an alternative raised edge at an alternative distance from the second substrate.

19. The electronic device of claim 12, wherein a top surface the support substrate includes an alignment mark configured to facilitate aligning a bracket structure with the top surface of the support substrate.

20. An electronic device, comprising:

a support substrate;

a first substrate disposed on the support substrate;

a second substrate disposed on the support substrate; and an underfill material applied (1) between the support substrate and the first substrate and (2) between the support substrate and the second substrate, wherein at least a portion of the underfill material has a raised edge at a first distance from the first substrate;

after the underfill material is applied and hardened, the underfill material extends beyond a third edge by a bleed-out range, and does not have the raised edge near the third edge; and the bleed-out range is greater than the first distance.

* * * * *